INVENTORS M. M. ATALLA
E. J. SCHEIBNER
E. TANNENBAUM
BY
H. W. Lockhart
ATTORNEY 2,899,344

FABRICATION OF SEMICONDUCTOR DEVICES HAVING STABLE SURFACE CHARACTERISTICS

Martin M. Atalla, Mountainside, Edwin J. Scheibner, Westfield, and Eileen Tannenbaum, Murray Hill, N.J., assignors to Bell Telephone Laboratories, Incorporated, New York, N.Y., a corporation of New York Application April 30, 1958, Serial No. 732,026

6 Claims. (Cl. 148—1.5)

Figure 1:
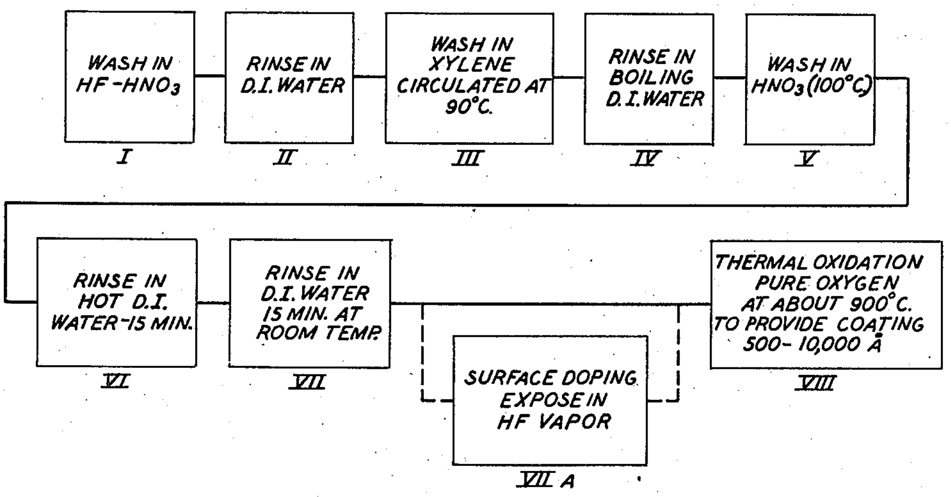
Figure 1:
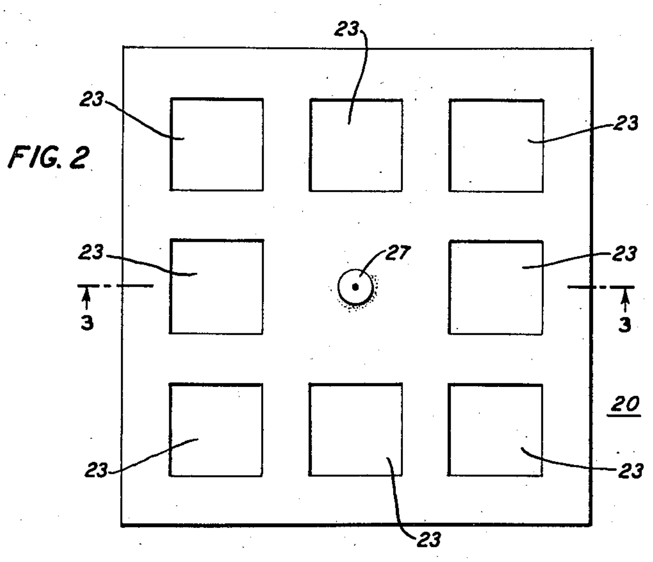
Figure 1:
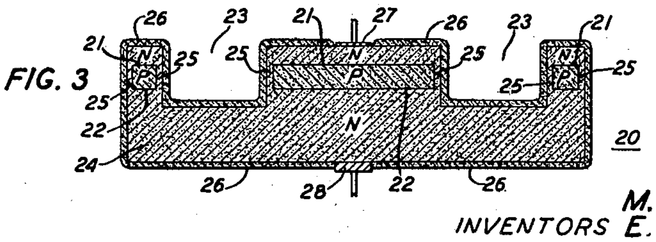

This invention relates to the fabrication of semiconductor devices and, more particularly, to methods of permanently fixing the electrical character of semiconductor surfaces.

From the outset of the semiconductor art, the significance of the device surface has been a subject of extensive study. There has been some appreciation of the desirability of providing protective coverings on particular surfaces of semiconductor devices. For example, United States Patent 2,816,850, granted December 17, 1957, to H. E. Haring discloses the application of a particular protective coating over the intermediate conductivity-type region of junction-type transistors. Also, United States Patent 2,748,325, issued May 29, 1956, to D. A. Jenny shows the use of a thermally-grown oxide on a silicon PN junction structure for providing a protective coating across the exposed junction edge.

However, it has been found in the fabrication of semiconductive devices requiring surfaces of particular and stable electrical characteristics that it is not enough merely to apply a protective coating but rather it is of the utmost importance to produce a surface of prescribed physical and electrical characteristics immediately prior to the application of the protective layer. Thus, although it is well known to provide protective coatings of various kinds on semiconductor surfaces, this invention is directed to a novel process which combines particular surface treatments with provision of protective thermally-grown oxide coatings.

Therefore, one object of this invention is improved semiconductor devices and, more particularly, devices having stable surface characteristics.

Another object is to facilitate and reduce the cost of the fabrication of semiconductor devices.

A further object is a method of producing surface oxide films which induce particular conductivity-type surface regions on semiconductor devices, which films are extremely stable both electrically and physically.

A better understanding of this invention will be facilitated from a consideration of the concept of surface states. The energy band structure at the surface of the solid, more particularly a semiconductor, has evolved from the formulations and investigations of various workers. One exposition in this connection entitled "Surface States and Rectification at a Metal to Semiconductor Contact" by J. Bardeen appears in the Physical Review, volume 71, page 717, published in 1947. In accordance with one theory of this invention, it has been determined that an atomically clean semiconductor surface is not desirable from the standpoints of device compatibility and electronic stability. For purposes of analysis, a semiconductor surface having a film or layer, for example, an oxide, thereon, can be characterized as having several different forms of surface states. Certain of these, termed "fast" states, are located at the interface between the semiconductor body and the surface film and others, referred to as "slow" states, are located within or on the surface of the film itself. In general, it has been found that the disadvantageous surface instabilities are a consequence of the presence of slow states. Therefore, the procedures of this invention are directed, in the main, to control of surface impurities prior to and during the provision of a protective oxide film.

In accordance with one embodiment of this invention, a body of single crystal silicon of high purity is subjected to the following succession of processing steps. The device is first etched in a mixture of hydrofluoric and nitric acid, followed by a chemical cleaning in a hot solvent such as xylene or benzene. The device is then rinsed in boiling deionized water and next it is treated in hot nitric acid. Subsequent to this acid treatment, the body is rinsed in hot deionized water for a short period, followed by a similar period of rinsing in deionized water at room temperature. Upon completion of these steps, the silicon body exhibits surfaces which are lightly oxidized and hydrophilic in character. At this juncture in the fabrication, the choice is exercised as to the final character of the device surface. With a high purity crystal, a permanent P-type conductivity surface is induced by next subjecting the silicon device to high purity oxygen at a temperature of about 900 degrees centigrade for a short period of time. Under these conditions, the surface prepared in accordance with the preceding method will have a surface film of silicon oxide having a thickness which may range from of the order of 200 Angstroms to of the order of 10,000 Angstroms and which will induce a permanent P-type conductivity surface region.

In accordance with another embodiment, however, an oxide induced N-type conductivity surface is provided by subjecting the silicon surface to hydrofluoric acid vapor for a short time immediately prior to the thermal oxidation step. This has been termed "surface doping" and can be carried out in various other vapors or salt solutions, for example, chlorine.

In accordance with another embodiment, the N-type conductivity characteristic may be induced by diffusing certain significant impurities, for example, gold and iron, into the silicon body prior to the surface treatment steps, which impurities will then be drawn into the surface oxide film during the thermal oxidation step resulting in an N-type conductivity surface layer.

Thus, one feature of the method of this invention is the fabrication of oxide-induced P-type conductivity surfaces on semiconductor devices by thermal oxidation of specially treated surfaces of a lightly oxidized, hydrophilic character.

Another feature is the fabrication of oxide-induced N-type conductivity surfaces by the controlled introduction of significant impurities coupled with the thermal oxidation of a specially treated surface on a semiconductor device.

The invention and its further objects and advantages will be better understood from the following detailed description taken in connection with the drawing in which:

Fig. 1 is a block diagram illustrating the various steps of the method of this invention; and Figs. 2 and 3 are, respectively, plane and sectional views of a semiconductor device fabricated in part in accordance with the method of this invention.

A consideration of the process in accordance with this invention will be facilitated by referring to the flow diagram of Fig. 1. As indicated by step I, the semiconductor body is first immersed in a mixture of nitric acid and hydrofluoric acid. A convenient etching solution comprises six parts by volume of concentrated nitric acid to one part by volume of 48 percent dilute hydrofluoric acid at room temperature. This etching step is then followed by rising in deionized water, the conductivity of which may be specified as less than .05 micromho.

It should be pointed out that the silicon body being subjected to this surface treatment may be in the form of a device which has been completely fabricated except for the attachment of external electrodes, or advantageously the electrodes may already be affixed to the semiconductor device. Following the above treatments specified in steps I and II, the semiconductor element is rinsed in a continuously flowing distillate of boiling xylene for about 15 minutes, as set forth in step III. Next as specified in step IV, this treatment is followed by a rinse in boiling deionized water for about 15 minutes. It has been determined that the process as specified to this point removes the bulk of organic surface residue. For this purpose, other hydrocarbon solvents, such as benzene, may be substituted for xylene. During this processing it is important that the semiconductor device be protected from any possible outside contamination. For this purpose, it is convenient to handle the semiconductor element in a small basket, or similar container, made of an inert material such as platinum.

In accordance with step V, the device is next immersed in concentrated nitric acid at about 100 degrees centigrade for approximately 15 minutes. This step appears to oxidize both the chemically bound organic substances and any metallic impurities which may be present. More importantly, this step also provides a desirable light oxidation of the silicon surface. Following this treatment, and as set forth in step VI, the element is rinsed in circulating deionized water at about 90 degrees centigrade, which is immediately followed by a further rinse for about 15 minutes in a similar bath at room temperature. Then, as indicated by the solid line connecting to step IX of Fig. 1, under certain conditions the element may be subjected immediately to an oxidation treatment which conveniently is carried out in a ceramically-enclosed oven with a minimum exposure to room air and with no effort to dry any water remaining from the washing operation.

It is most important in accomplishing the thermal oxidation of the silicon surfaces to effect this treatment before the condition which has been achieved by the surface treatment of steps I through VII has been permitted to deteriorate. The surface attained upon the completion of step VII of the surface treatment may be characterized as one which is lightly oxidized and almost perfectly hydrophilic. That is, the surface may be examined by a technique such as the well-known water break and water spray tests in which the contact angle of water droplets determines whether the surface is wettable or hydrophilic, or whether the opposite or hydrophobic condition obtains. However, it should be noted that the hydrophilic condition alone does not define a satisfactory surface for the provision of a thermally-grown oxide film.

The thermal oxidation treatment in step VIII is accomplished in a flow of oxygen of high purity at an elevated temperature which advantageously may be about 900 degrees centigrade. The thickness of the oxide film is generally a function of the length of the treatment and satisfactory oxide films may be produced from of the order of 200 Angstroms to of the order of 10,000 Angstroms. Generally, devices which must attain high breakdown voltages require thick oxide films, for example, in excess of 10,000 Angstroms. The conductivity type of the surface which is thus protected by an oxide film is a function of the impurity content of the silicon crystal prior to the oxidation treatment and of the treatment immediately prior to or during the thermal oxidation step. If the crystal is originally of high purity material, such as is produced by the floating zone technique as disclosed in the application of H. C. Theuerer, Serial No. 326,561, filed December 17, 1952, the surface treatment set forth in detail above, which is followed immediately by the thermal oxidation step, will produce surfaces which are of P-type conductivity. Advantageously, the silicon single crystal material has an impurity concentration of about $10^{-13}$ atoms per cubic centimeter. On the other hand, there are several methods by which the oxide covered silicon surface may be rendered of N-type conductivity.

One such technique is illustrated by the surface-doping step specified in block VII A which is interposed as an alternative following completion of the preliminary surface treatment and the final thermal oxidation. This step consists in subjecting the semiconductive element to a hydrofluoric acid vapor by suspending it for a brief interval over such a solution. As noted hereinbefore, the vapors of certain other salt solutions, such as chlorine, have been found to be satisfactory. Here again, it is important that exposure to room air and possible other contaminants be minimized. Upon thermal oxidation of the device, an N-type conductivity surface is achieved.

In connection with the oxygen provided for the thermal oxidation treatment, the purity of the gas may be insured by well-known techniques including passing the oxygen through liquid nitrogen. Under certain circumstances, it may be desirable to circulate the oxygen through deionized water prior to passing it over the semiconductor element. This generally results in a faster rate of oxide film growth.

Another technique for producing an N-type conductivity surface oxide comprises diffusing gold into the silicon material prior to carrying out the surface treatment. This may be accomplished by means well known in the art. For example, the gold may be deposited on a surface by evaporation and diffused through the body by heating at a temperature of about 1100 degrees centigrade. This silicon material is then processed in accordance with the procedure specified in steps I through VIII, omitting the step VII A. During the thermal oxidation treatment at the elevated temperature of step VIII, the gold will diffuse outward into or close to the surface oxide film and thereby induce N-type conductivity. It has been found that other elements, such as iron, are similarly effective and it may be remarked that the significance of these impurities for inducing N-type conductivity in a surface layer may be different from the effect produced by the same elements in the bulk materials. Specifically, in this surface treatment gold is effective to induce N-type conductivity, whereas in bulk silicon gold is usually regarded as an acceptor-type impurity inducing P-type conductivity.

It will be observed from the foregoing-described steps that the methods in accordance with this invention lend themselves to two general areas of use. That is, the process may be used to insure that a surface on N or P-type conductivity material is stabilized or passivated in the same conductivity type as that of the underlying material, or in certain applications it will be advantageous to provide a thin surface layer or film of a conductivity type opposite to that of the bulk material, thus providing a channel of extreme thinness of a particular conductivity type.

For example, Figs. 2 and 3 illustrate a semiconductor device structure of the field effect varistor type disclosed in patent application, Serial No. 700,319, filed December 3, 1957, and assigned to the assignee of the present application. Devices of this general type depend to a considerable extent for their operation upon the provision of a very thin channel region extending across the transition region of a PN junction. It is desirable also for many of the uses of such devices that the peripheral length of the junction bordering such channel be as great as possible in comparison to the length of the thin channel. Such an arrangement is achieved in the structure depicted in Figs. 2 and 3. The element may comprise a single crystal body 20 of silicon of N-type conductivity material which has therein two PN junctions 21 and 22 produced by diffusion in accordance with well-known techniques. One such method may comprise first diffusing boron from both sides of the original wafer to produce P-type regions and leaving an intermediate N-type conductivity region. This step may then be followed by the diffusion of a donor element, such as phosphorus, from both sides of the wafer to convert the surface portion again to N-type conductivity. The converted P-type and N-type layers then may be removed from one side of the wafer by etching.

The wafer which then comprises successive layers of NPN conductivity types is then suitably masked and the square depressions 23 are then etched out through both junctions and down into the base N-type material 24. At this stage, the method in accordance with this invention may be adopted to produce the very thin N-type surface channels 25 bridging the exposed P-type intermediate layer. As has been set forth above, such N-type conductivity layer may be induced conveniently by subjecting the device to the process defined by steps I through VIII, including the treatment of step VII A. At the same time the device is provided with a surface oxide layer 26 which insures a stable surface condition. Finally, the device is provided with electrodes 27 and 28 as shown. In this connection it has been found practicable to make a substantially ohmic connection through a thermally-grown oxide without otherwise removing the oxide film. For example, the thermo-compression bonding process disclosed in the application of O. L. Anderson and H. W. Christensen, Serial No. 619,639, filed October 31, 1956, has been found suitable for this process. By this process, for example, a gold wire lead may be applied to the silicon surface by the use of moderate pressure and temperature of about 200 degrees centigrade for less than one minute and a pressure sufficient to produce a deformation of the gold of about 20 percent. The particular advantages of such a structure will be apparent from the cross-sectional view which shows the several very thin N-type channels or pinch-off regions. The complete device having a staple protective coating may be used without further protective covering, such as a metal container or other encapsulating material, or with a covering whose requirements are considerably more relaxed than would otherwise be the case.

Although the foregoing-described method is the preferred procedure, there are specific advantages in substituting for certain portions of the cleaning operation either a prolonged vacuum baking operation or a baking step in a pure helium atmosphere.

Although the invention has been disclosed in terms of the foregoing specific embodiments, it will be recognized that various modifications thereof may be devised by those skilled in the art which will be within the scope and spirit of this invention.

What is claimed is:

1. The method of providing an electrically stable semiconductor surface comprising washing a body of semiconductive material in an acid solution, rinsing said body in deionized water, immersing said body in a hydrocarbon solvent selected from the group consisting of benzene and xylene at about 100 degrees centigrade, rinsing said body in boiling deionized water, immersing said body in nitric acid at about 100 degrees centigrade for a short time, rinsing said body in circulating deionized water at about 90 degrees centigrade, then rinsing said body in circulating deionized water at room temperature, and immediately placing said body in a stream of substantially pure oxygen at a temperature of about 900 degrees centigrade for a sufficient time to provide an oxide film on the surfaces of said body the order of at least 200 Angstroms thickness.

2. The method of inducing a P-type conductivity surface region on a single crystal silicon body comprising washing said body in a mixture of nitric acid and hydrofluoric acid, rinsing said body in deionized water, immersing said body in a solution of boiling xylene for about 15 minutes, washing said body for about 15 minutes in boiling deionized water, immersing said body in hot nitric acid for a short interval, rinsing said body in circulating deionized water at an elevated temperature for a short interval and for a longer interval at a lower temperature, and immediately placing said body in a stream of substantially pure oxygen at a temperature of about 900 degrees centigrade.

3. The method of fabricating a semiconductor device comprising providing a body of single crystal silicon, washing said body in a mixture of hydrofluoric and nitric acid, rinsing said body in deionized water, washing said body in flowing hot xylene, washing said body in boiling deionized water, immersing said body in hot nitric acid, rinsing said body in circulating hot deionized water for a short interval, rinsing said body in denionized water at room temperature for a longer interval and immediately placing said body in a stream of substantially pure oxygen at about 900 degrees centigrade for a period sufficient to produce an oxide layer having a thickness of between of the order of 200 and 10,000 Angstroms, and cooling said body.

4. The method in accordance with claim 3 which includes the step of exposing said body to a vapor of hydrofluoric acid for a short interval immediately before placing the body in a stream of hot oxygen.

5. The method of fabricating a semiconductor device having a thin N-type surface layer thereon comprising providing a body of single crystal silicon, diffusing an impurity of the type selected from the group consisting of gold and iron into said body, washing said body in a mixture of hydrofluoric and nitric acid, rinsing said body in deionized water, washing said body in flowing hot xylene, washing said body in boiling deionized water, immersing said body in hot nitric acid, rinsing said body in circulating hot deionized water for a short interval, rinsing said body in deionized water at room temperature for a longer interval and immediately placing said body in a stream of substantially pure oxygen at about 900 degrees centigrade for a period sufficient to produce an oxide layer having a thickness of between the order of 200 and 10,000 Angstroms, and cooling said body.

6. The method of fabricating a semiconductive device comprising providing a wafer of single crystal silicon material of one conductivity type, successively diffusing significant impurities into said body to produce an intermediate region in said body of opposite conductivity type and outer regions of said one conductivity type, applying low resistance contacts on opposite faces of said wafer to said outer regions, washing said wafer in a mixture of nitric acid and hydrofluoric acid, rinsing said wafer in deionized water, immersing said wafer in a solution of boiling xylene for about 15 minutes, washing said wafer in boiling deionized water, immersing said wafer in hot nitric acid, rinsing said wafer in circulating deionized water at an elevated temperature followed by rinsing at a lower temperature, exposing said body in a vapor of hydrofluoric acid for a short interval, and immediately placing said body in a stream of substantially pure oxygen at a temperature of about 900 degrees centigrade, thereby to provide a protective oxide coating on said wafer and an induced N-type conductivity layer immediately beneath said coating.

References Cited in the file of this patent

UNITED STATES PATENTS

| | | |
|---|---|---|
| 2,462,218 | Olsen | Feb. 22, 1949 |
| 2,583,681 | Brittain et al. | Jan. 29, 1952 |
| 2,705,192 | Faust et al. | Mar. 29, 1955 |
| 2,736,639 | Ellis | Feb. 28, 1956 |
| 2,738,259 | Ellis | Mar. 13, 1956 |
| 2,768,100 | Rulison | Oct. 23, 1956 |

FOREIGN PATENTS

| | | |
|---|---|---|
| 503,304 | Canada | May 25, 1954 |